United States Patent
North

[19]

[11] Patent Number: 6,118,829
[45] Date of Patent: Sep. 12, 2000

[54] APPARATUS AND METHOD FOR AUTOMATIC MODE SELECTION IN A COMMUNICATIONS RECEIVER

[75] Inventor: Brian B. North, Los Gatos, Calif.

[73] Assignee: Integration Associates, Inc., Mountain View, Calif.

[21] Appl. No.: 08/942,312

[22] Filed: Oct. 1, 1997

[51] Int. Cl.[7] .................................................. H04L 25/10
[52] U.S. Cl. ........................ 375/317; 375/316; 375/345
[58] Field of Search .................................... 375/344, 345, 375/316, 287, 377, 318, 319, 317; 455/138, 140, 184.1, 177.1, 197.2, 199.1, 219, 232, 234.1; 330/254, 260, 278; 327/1, 10, 16, 555

[56] References Cited

U.S. PATENT DOCUMENTS

| | | | |
|---|---|---|---|
| 3,619,660 | 11/1971 | Rugo .................................. | 307/264 |
| 5,134,707 | 7/1992 | Sakashita et al. ................. | 455/3.2 |
| 5,329,115 | 7/1994 | Lim ..................................... | 250/214 R |
| 5,361,395 | 11/1994 | Yamamoto ......................... | 455/32.2 |
| 5,557,634 | 9/1996 | Balasubramanian ............... | 375/222 |
| 5,585,952 | 12/1996 | Imai et al. ......................... | 359/135 |
| 5,706,110 | 1/1998 | Nykanen ............................ | 359/110 |
| 5,834,969 | 11/1998 | Umeyama et al. ................. | 327/553 |
| 5,864,591 | 1/1999 | Holcombe .......................... | 375/245 |
| 5,867,777 | 2/1999 | Yamaji et al. ..................... | 455/234.1 |
| 6,038,049 | 3/2000 | Shimizu et al. . | |

OTHER PUBLICATIONS

Ernesto Perea "Technology Directions; Optical Interconnects, High Temperature, & Packaging" Feb. 10, 1996, ISSCC96, 8 pages.

IBM Microelectronics "Infrared Transceiver Module—IBM31T1101" Nov. 6, 1996, http://www.chips.ibm.com.

Temic Semiconductors "TFDS 6000 Integrated Infrared Transceiver Module IrDA" Aug. 1996, 12 pages.

Hewlett–Packard "Infrared Transceiver Preliminary Technical Data HSDL–1100" Nov. 17, 1995.

Novalog, Inc. "SIRFIR™ 4Mbps IrDA Transceiver" Apr. 1996 info@novalog.com.

Dr. Keming W. Yeh and Dr. Lichen Wang "An Introduction to the IrDA Standard and System Implementation" Wireless System Design May 1996, 11 pages.

Temic Semiconductors "IrDA Compatible Data Transmission" Apr. 1996, pp. 1–18.

*Primary Examiner*—Chi H. Pham
*Assistant Examiner*—Emmanuel Bayard
*Attorney, Agent, or Firm*—McDonnell Boehen Hulbert & Berghoff; Vernon W. Francissen

[57] ABSTRACT

A method and apparatus are shown for automatically adjusting a response bandwidth and input sensitivity of a communications receiver responsive to a frequency of a received data signal. The response bandwidth is adjusted by switching a low pass filter into a receive path of the receiver when the received data signal is a low speed data signal and switching the low pass filter out of the receive path when the received data signal is a high speed data signal. The input sensitivity is adjusted by either changing a detection threshold of a comparator in the receive path or varying a gain of an input amplifier in the receive path. The high speed data signal is discerned when the low pass filter limits the response bandwidth of the receiver by a mode selection circuit which examines the duration of multiple pulses in a pulse train in the received data signal.

35 Claims, 9 Drawing Sheets

APPARATUS AND METHOD FOR AUTOMATIC MODE SELECTION IN A COMMUNICATIONS RECEIVER

BACKGROUND OF THE INVENTION

1. Field of Invention

The present invention relates to a circuit and method for automatically selecting between a high speed operating mode and a low speed operating mode in a communications receiver responsive to the mode of the incoming transmission signal.

2. Description of the Related Art

Infrared wireless data communication is a useful method for short range (in the approximate range of 0–10 meters) wireless transfer of data between electronic equipment; such as, cellular phones, computers, computer peripherals (printers, modems, keyboards, cursor control devices, etc.), electronic keys, electronic ID devices, and network equipment. Infrared wireless communication devices typically have the advantages of smaller size, lower cost, fewer regulatory requirements, and a well defined transmission coverage area as compared to radio frequency wireless technology (i.e. the zone of transmission is bounded by physical walls and therefore more useful in an office environment). In addition, infrared wireless communication has further advantages with regard to reliability, electromagnetic compatibility, multiplexing capability, easier mechanical design, and convenience to the user as compared to cable based communication technology. As a result, infrared data communication devices are useful for replacing 0–10 meter long data transfer cables between electronic devices, provided that their size and costs can be reduced to that of comparable cable technology. As examples of the type of wireless communications links that are presently in use, the Infrared Data Association (IrDA) Physical Layer Link Specification 1.1e specifies two main physical layer infrared modulation protocols.

Infrared data communications devices typically consist of transmitter and receiver components. The infrared data transmitter section consists of one or more infrared light emitting diodes (LEDs), an infrared lens, and an LED current driver. A conventional infrared data receiver typically consists of an infrared photodiode and a high gain receiver amplifier with various signal processing functions, such as automatic gain control (AGC), background current cancelling, filtering, and demodulation. For one-directional data transfer, only a transmitter at the originating end and a receiver at the answering end is required. For bi-directional communication, a receiver and transmitter at each end is required. A combined transmitter and receiver is called a transceiver.

In typical high volume applications, it is now standard practice to fabricate the receiver circuitry and transmitter driver in a single integrated circuit (IC) to produce a transceiver IC. In turn, a transceiver IC, infrared photodiode and LED along with lenses for the photodiode and LED are assembled together in a plastic molded package designed to be small in size and allow placement in the incorporating electronic device so as to have a wide angle of view (typically through an infrared window on its case). The transceiver IC is designed to digitally interface to some type of serial data communications device such as an Infrared Communication Controller (ICC), UART, USART, or a microprocessor performing the same function.

A representative example of a conventional infrared data transmitter and receiver pair is shown in FIG. 1. Infrared transmitter 10 includes LED 16 which generates a modulated infrared pulse in response to transistor 14 being driven by the data signal input at $D_{IN}$. The modulated infrared signal is optically coupled to an infrared detector, such as photodiode 24 normally operated in current mode (versus voltage mode) producing an output current which is a linear analog of the optical infrared signal falling on it. The infrared pulses generated by LED 16 strike photodiode 24 causing it to conduct current responsive to the data signal input at $D_{IN}$ thereby generating a data signal received at $D_{IR}$.

In receiver 20, the signal received at $D_{IR}$ is transformed into a voltage signal $V_{IR}$ and amplified by amplifier 26. The signal output from amplifier 26 then feeds into comparator 42 which demodulates the received signal by comparing it to a detection threshold voltage $V_{DET}$ in order to produce a digital output data signal at The received signal waveform will have edges with slope and will often include a superimposed noise signal. As a result, $V_{DET}$ is ideally placed at the center of the received signal waveform so that the output data signal has a consistent waveform width despite the slope of the received signal edges. Also, placing $V_{DET}$ at the center of the received signal improves the noise immunity of receiver 20 because the voltage difference between $V_{DET}$ and both the high and low levels of the received signal is maximized such that noise peaks are less likely to result in spurious transitions in $D_{OUT}$.

The received signal, however, can vary in amplitude by several orders of magnitude due primarily to variations in the distance between transmitter 10 and receiver 20. The strength of the received signal decreases proportional to the square of the distance. Depending on the range and intensity of the infrared transmitter, the photodiode outputs signal current in the range of 5 nA to 5 mA plus DC and AC currents arising from ambient infrared sources of sunlight, incandescent and fluorescent lighting. As a consequence, the center of the received signal waveform will vary, whereas $V_{DET}$ must generally be maintained at a constant level. To address this problem, receivers typically include an automatic gain control (AGC) mechanism to adjust the gain responsive to the received signal amplitude. The received signal is fed to AGC peak detector 36 which amplifies the signal and drives current through diode 32 into capacitor 28 when the signal exceeds the AGC threshold voltage $V_{AGC}$ in order to generate a gain control signal. The gain control signal increases in response to increasing signal strength and correspondingly reduces the gain of amplifier 26 so that the amplitude of the received signal at the output of amplifier 26 remains relatively constant despite variations in received signal strength.

At a minimum, infrared receiver 20 amplifies the photodetector signal current and then level detects or demodulates the signal when it rises above the detect threshold $V_{DET}$ thereby producing a digital output pulse at $D_{OUT}$. For improved performance, the receiver may also perform the added functions of blocking or correcting DC and low frequency AC ambient (1–300 uA) signals and Automatic Gain Control (AGC) which improves both noise immunity and minimizes output pulse width variation with signal strength.

Data can be modulated on the infrared transmitted signal by a number of well known methods. One popular method is defined by the Infrared Data Association (IrDA). IrDA Physical Layer Link Specification 1.1e specifies two main physical layer infrared modulation methods. One method is a low-speed (2 Kbp/s to 1.15 Mbp/s) on-off infrared carrier, a synchronous modulation where the presence of a pulse indicates a 0 bit and the absence of a pulse indicates a 1 bit.

The second method is a high speed (4 Mb/s) synchronous Four Pulse Position Modulation (4 PPM) method in which the time position of a 125 nS infrared pulse in a 500 nS frame encodes two bits of information. Communications protocols often include a preamble, which for the 1.1e specification is sixteen repeated transmissions of a predetermined set of symbols.

The IrDA specification requires that high speed receivers be able to operate in the low speed mode as well in order to establish contact with either a transmitter operating in either low or high speed mode. To obtain high speed performance, the receiver circuit must typically have higher bandwidth capability. However, as the bandwidth response is increased to accommodate high speed performance, the amount of background noise integrated into the receiver response also increases due to the wider bandwidth spectrum. In other words, the root mean square (RMS) contribution of the background noise to the overall signal response of the receiver becomes proportionally higher.

To accommodate the higher noise level in the receiver response, the input sensitivity must be approximately 200 nA, compared to about 50 to 100 nA for low speed mode, which is accomplished by raising the $V_{DET}$ voltage level discussed above. However, because the detection threshold is higher for high speed mode, low speed signal transitions may be lost. Therefore, it is advantageous to limit the bandwidth response to only that required to obtain good pulse fidelity (i.e. approximately twice the transmission frequency) so that less of the background noise spectrum is amplified and the input sensitivity can be kept correspondingly lower.

Mode selection at the receiving end of the transmission is therefore typically accomplished by raising the bandwidth of the receiver response until no data response is received in order to determine the maximum speed of the communications link. In other words, the bandwidth of the receiver response is increased until the communications link fails. The link failure may be due to a limitation in the light interface, such as high ambient light levels, or performance limitations in either the transmitter or receiver circuits. In general, the bandwidth of the receiver is only adjusted at the point of low-high speed mode selection.

Many conventional receiver devices can operate in either the low-speed mode or the high speed mode. One approach is to have two separate receive paths: one path for high speed response and one path for low speed response. This approach results in additional circuit area for the two receive paths and, often, additional circuit pin outs for communication outside of the receiver device. Another approach is to have a mode select control with either a dedicated pin out or a multiplexed pin out where the mode selection is performed in the downstream communications device, such as a UART or USART, that receives the demodulated data from the receiver. This approach requires additional function to be designed into the downstream device, requires a control pin out for control communication, and generally requires additional time for response.

SUMMARY OF THE INVENTION

The present invention relates to an apparatus and method for automatically selecting an operating mode of a communications receiver based upon the operating mode of a received transmission signal.

An embodiment of a receiver circuit, according to the present invention, includes a circuit input terminal configured to receive an input data signal, a circuit output terminal, an input amplifier having input and output terminals, the input terminal of the input amplifier being coupled to the circuit input terminal, and a first comparator having first and second input terminals and an output terminal, the first input terminal being coupled to the output terminal of the input amplifier, the second input terminal being configured to receive a detection threshold voltage, and the output terminal of the first comparator being coupled to the circuit output terminal. The receiver also includes a filter and a switch coupled in series with the filter between the output terminal of the input amplifier and a first power supply rail, wherein the switch is configured to switch to a first position responsive to receiving a low speed mode control signal at a control terminal of the switch, and further wherein the switch is configured to switch to a second position responsive to receiving a high speed mode control signal at the control terminal of the switch. A mode selection circuit is configured to generate the low speed mode control signal responsive to a low speed data signal generated at the output of the first comparator responsive to the input data signal and generate the high speed mode control signal responsive to a low speed data signal generated at the output of the first comparator responsive to the input data signal.

An embodiment of a method, according to the present invention, for receiving high and low speed signals in a receiver involves providing a receive path configured to receive an input data signal, wherein the input data signal includes one of the high speed signal and the low speed signal. The input data signal is compared to a detection threshold voltage in order to produce a demodulated data signal. The receive response bandwidth of the receive path is set to a first bandwidth level responsive to a low speed mode control signal and set to a second bandwidth level responsive to a high speed mode control signal, wherein the second bandwidth level is greater than the first bandwidth level. The low speed mode control signal is generated responsive to the low speed signal. The high speed mode control signal is generated responsive to the high speed signal.

Another embodiment of a communications receiver according to the present invention includes amplifier means for receiving an input data signal and amplifying the input data signal to produce an amplified data signal, demodulating means for transforming the amplified data signal into a demodulated data signal, and filtering means for filtering the amplified data signal. The receiver also includes switching means coupled in series with the filtering means for activating the filtering means responsive to a low speed mode signal and deactivating the filtering means responsive to a high speed mode signal. A mode selection means monitors the demodulated data signal and generates the low speed mode signal responsive to a low speed pulse train in the demodulated data signal and generates the high speed mode signal responsive to a high speed pulse train in the demodulated data signal.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

In the following drawings, elements which are identical or analogous between drawings are identified with reference numbers which are also identical or analogous.

DETAILED DESCRIPTION OF THE PRESENT INVENTION

Figure 2:
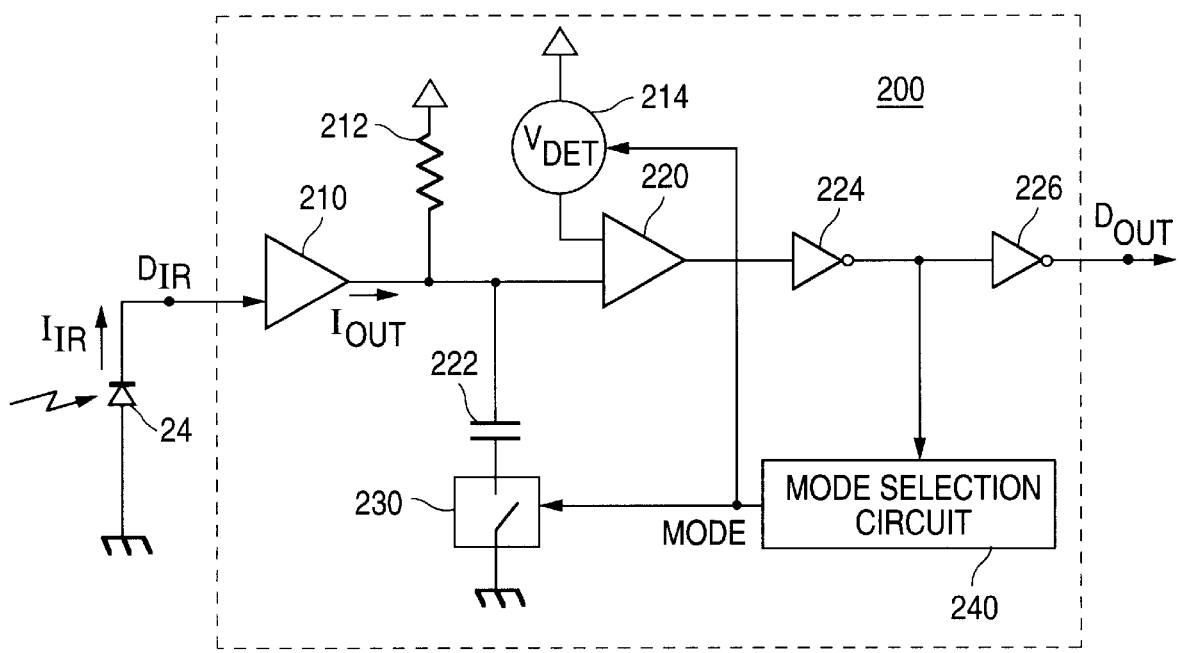
FIG. 2 is a functional block diagram of an embodiment of an infrared receiver according to the present invention.

An embodiment of an infrared receiver 200 according to the present invention is shown in FIG. 2. A transconductance amplifier 210 converts the current signal $I_{IR}$ received from the photo-diode 24 at input terminal $D_{IR}$ to an output current signal $I_{OUT}$. $I_{OUT}$ is converted to a voltage signal by resistor 212 and then compared to a detect threshold voltage $V_{DET}$, generated by variable voltage reference 214, by comparator 220. Comparator 220 outputs a demodulated data signal waveform that is inverted by inverter 224. The inverted data signal output by inverter 224 is input to inverter 226 for output of a recovered data signal at output terminal $D_{OUT}$.

The inverted data signal output from inverter 224 is also input to mode selection circuit 240. Mode selection circuit 240 monitors the transitions in the inverted data signal stream and outputs a mode selection signal which controls the selection of the detection threshold voltage $V_{DET}$ in variable voltage reference 214 and controls the operation of switch 230 which is coupled in series with capacitor 222 between a ground potential rail and the output of amplifier 210.

The mode selection signal is initially in a low speed mode state wherein switch 230 is closed so that capacitor 222, acting as a low-pass filter, limits the bandwidth of the current signal $I_{OUT}$ and, thusly, the bandwidth response of receiver 200. The low speed mode state also causes variable voltage reference 214 to output a lower value for $V_{DET}$ that corresponds to a higher input sensitivity, such as an input sensitivity on the order of 50 to 100 nA. The mode selection circuit 240 then looks for a transition in the signal output from inverter 224. When mode selection circuit 240 observes a transition, the mode selection circuit 240 starts a timer and times the period until the next transition in order to measure the duration of the pulse in the input signal and, from the duration of the pulse, determine whether the pulse is a high speed or a low speed pulse.

If the mode selection circuit 240 detects a high speed data signal, then it switches the MODE signal into a high speed mode state which causes switch 230 to open and remove capacitor 222 from the receive path of the circuit, thereby increasing the bandwidth response of the receiver, and also raises the detection threshold voltage $V_{DET}$ output by variable voltage reference 214 to a higher voltage level, thereby lowering the input sensitivity to compensate for the higher level of noise contained within the input response. An example of the level of input sensitivity in high speed mode is approximately 200 nA.

The mode selection circuit 240 continues to monitor the pulse train in the signal output from inverter 224. If low speed pulses are received, then the mode selection circuit 240 switches the MODE signal back to low speed mode which closes switch 230 to again limit the response bandwidth of the receiver 200 and lower the level of the $V_{DET}$ output by variable voltage reference 214 in order to raise the input sensitivity of the receiver.

Typically, if the distance between the transmitter and receiver remains the same (i.e. the signal amplitude remains the same), the receiver will be able to discern the low speed pulses in high speed mode. However, if the distance between transmitter and receiver increases, then the receiver in high speed mode may be unable to detect the low speed pulse because of the lower input sensitivity of the receiver in high speed mode. The mode selection circuit, when it is in high speed mode, will typically time-out after a predetermined time period wherein no pulses are received and return to the low speed mode.

Figure 3:
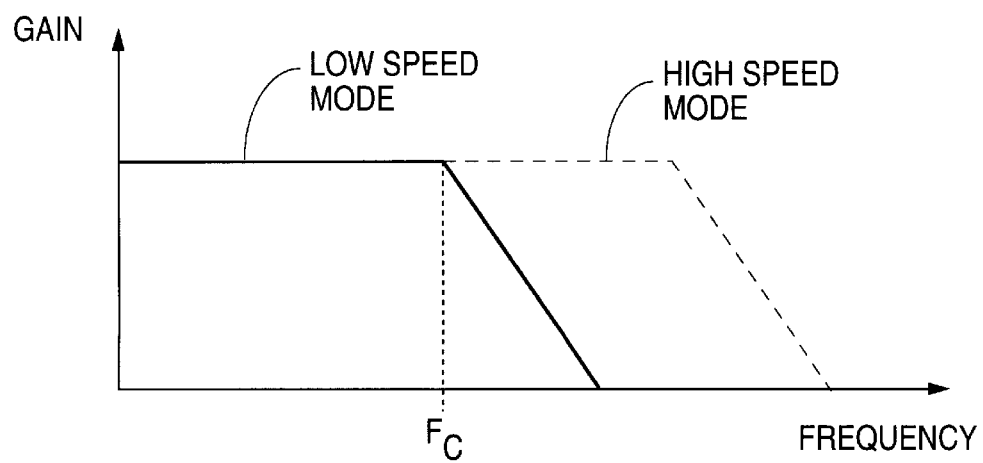
FIG. 3 is a frequency response diagram illustrating the operation of the receiver of FIG. 2.

The resulting response of receiver 200 of FIG. 2 is shown in the frequency response graph of FIG. 3. When mode selection circuit 240 is in the low speed mode with switch 230 closed and capacitor 222 is coupled into the circuit, then the frequency response illustrated with the solid line is obtained. The frequency cut-off point $F_C$ is determined by the resistance and capacitance (RC) time constant of resistor 212 and capacitor 222. When mode selection circuit 240 is in the high speed mode with switch 230 open and capacitor 222 cut out of the circuit, then the higher bandwidth frequency response illustrated with the dashed line is obtained.

For the IrDA communications protocol, the mode selection circuit 240 is constructed to consider pulses in the range between 60 nS and 600 nS to be high speed mode pulses. Pulses that are less than 60 nS in duration are ignored as spurious and the mode selection circuit 240 maintains the mode state that it is in when the spurious transition arrives. Pulses greater than 600 nS duration can be considered low speed pulses.

However, the IrDA specification also sets forth a sixteen bit high speed preamble that must be transmitted. The specification provides up to sixteen preamble word periods for a receiver to come into compliance with the specification. When the receiver is operating with the lower response bandwidth of low speed mode, portions of the high speed preamble can become distorted so that they appear to be low speed pulses. The discussion below regarding various embodiments of mode selection circuits addresses this problem. When the mode selection circuit 240 is constructed to address the particular requirements of the IrDA communications protocol, then the receiver 200 according to the present invention is able to determine the mode of operation of the transmitted signal and comply with the IrDA specification within the sixteen bit preamble provided by the specification.

Figure 4:
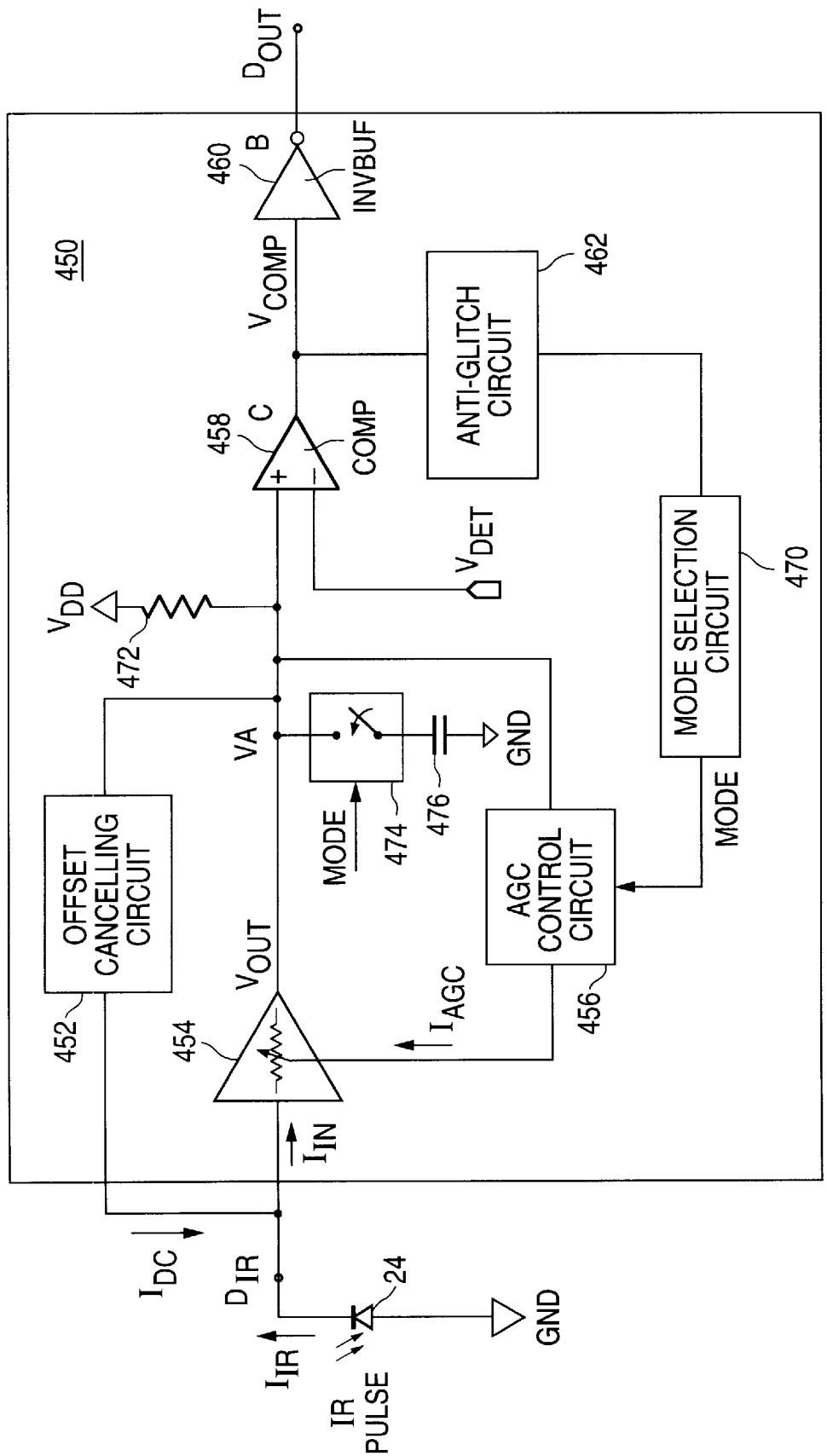
FIG. 4 is a functional block diagram of another embodiment of an infrared receiver according to the present invention.

As an alternative to varying the threshold voltage $V_{DET}$ of the comparator, the gain of the input amplifier can be varied to adjust the input sensitivity of the receiver. An embodiment of a receiver 450 which adjusts the input gain is shown in FIG. 4. The receiver 450 is an adaptation of a receiver illustrated in commonly assigned patent application Ser. No. 08/915,216 entitled APPARATUS AND METHOD FOR LOW POWER OPERATION WITH HIGH SENSITIVITY IN A COMMUNICATIONS RECEIVER filed Aug. 20, 1997, which is incorporated herein by reference for all purposes.

Figure 1:
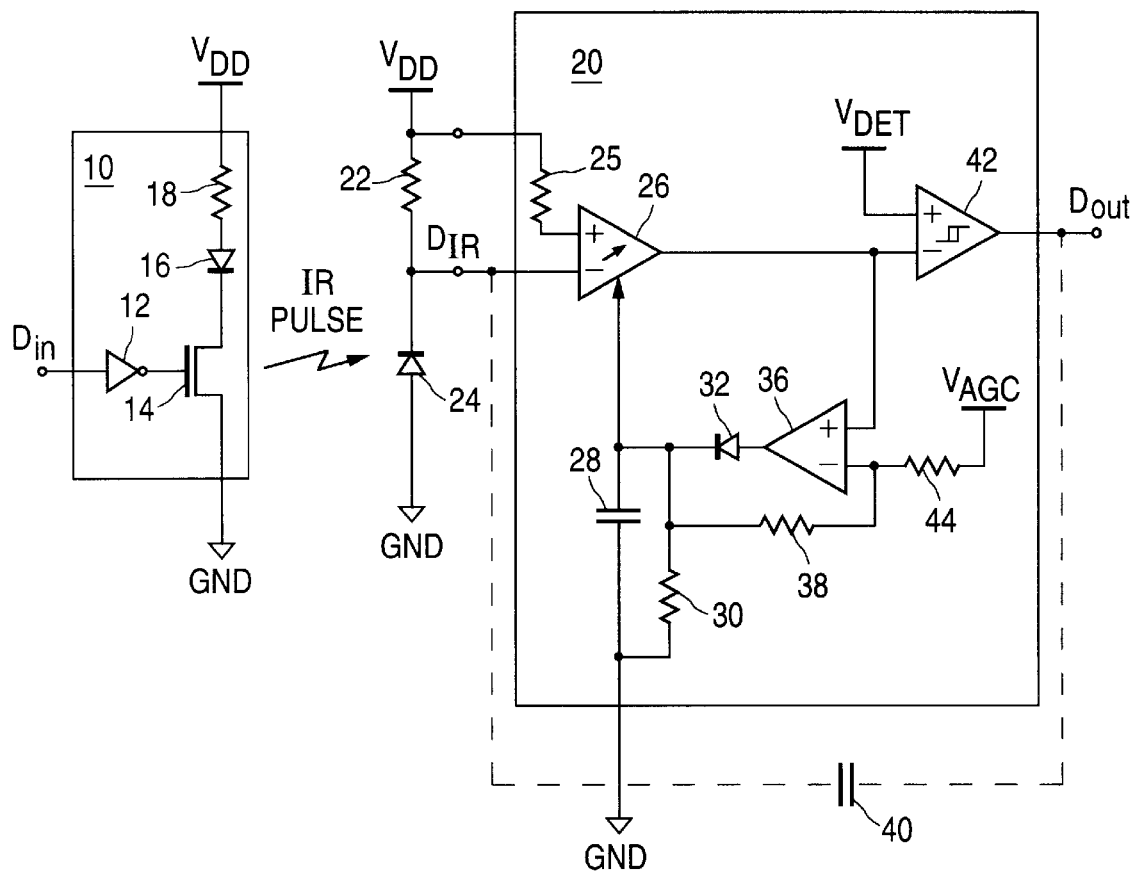
FIG. 1 is a circuit diagram of a conventional infrared transmitter receiver pair.

The receiver 450 consists of a variable gain trans-impedance amplifier 454 which converts the current signal $I_{IR}$ received from the photo-diode 24 to a voltage signal $V_{OUT}$ which is then compared to a detect threshold voltage $V_{DET}$ by comparator 458. The output of comparator 458 is used to drive buffer 60 which outputs a recovered data signal at terminal $D_{OUT}$. The offset canceling circuit 452 removes any input referred offsets of the amplifier 454 and any background current from photodiode 24 present at the input to amplifier 454. The AGC control circuit 456, which can be a circuit similar to the AGC circuit shown in receiver 20 in FIG. 1, monitors the waveform at the input of comparator 458 and outputs AGC control signal $V_{AGC}$, which controls the gain of trans-impedance amplifier 454. The feedback loop composed of AGC control circuit 456 and trans-impedance amplifier 454 attempts to maintain a more or less constant signal level at the input of comparator 458 and thereby compensate for the large dynamic range of the input signal received by photo-diode 24.

When the transmission channel is idle, AGC control circuit 456 will force amplifier 454 into its highest gain state as the circuit will otherwise not be able to determine very weak pulses from the condition where no pulses are present. Most AGC schemes in receivers increase the bias currents in order to increase the overall gain of the receiver. However, as described in the application for an APPARATUS AND METHOD FOR LOW POWER OPERATION WITH HIGH SENSITIVITY IN A COMMUNICATIONS RECEIVER, amplifier 454 and AGC control circuit 456 are designed so that amplifier 454 consumes the minimum supply current level under a no-signal present condition.

In the present invention, the signal $V_{COMP}$ at the output of comparator 458 is input to an optional anti-glitch circuit 462 which blocks signals that are below a predetermined duration in order to remove spurious signals. The output of anti-glitch circuit 462 is input to mode selection circuit 470 which determines the mode of operation indicated by the pulse train received at input terminal $D_{IR}$. The mode signal output by mode selection circuit 470 is input to AGC control circuit 456 in order to adjust the minimum supply current level, and therefore the gain, of amplifier 454. For instance, when the mode signal indicates a low speed signal mode, then the level of $I_{AGC}$ input to amplifier 454 from AGC control circuit 456 is lower and the gain of amplifier 454 is correspondingly higher. Similarly, when the mode signal indicates a high speed signal mode, then the level of $I_{AGC}$ input to amplifier 454 from AGC control circuit 456 is raised and the gain of amplifier 454 is correspondingly reduced.

Figure 5:
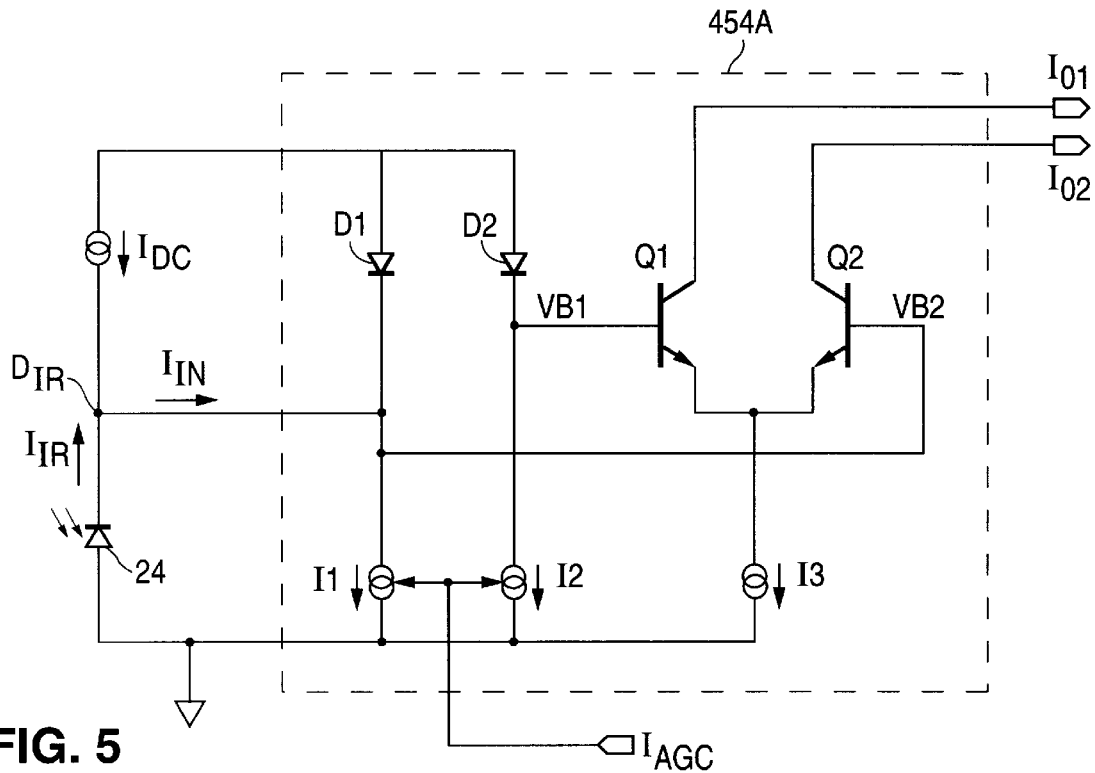
FIG. 5 is a circuit diagram of an input stage of a current controlled amplifier of the circuit of FIG. 4.

FIG. 5 illustrates an embodiment of an input stage 454A of amplifier 454 which has higher gain at lower current levels, as described in further detail in the application for an APPARATUS AND METHOD FOR LOW POWER OPERATION WITH HIGH SENSITIVITY IN A COMMUNICATIONS RECEIVER. The technique used is based on the function of a Gilbert gain cell, which includes diodes D1 and D2 along with transistors Q1 and Q2. The complete receive chain of amplifier 454 can consist of one or many such gain cells cascaded, wherein $I_{O1}$ and $I_{O2}$ are complimentary current signals which would be coupled to the base electrodes of the corresponding Q1 and Q2 transistors, respectively, in a subsequent gain cell and the differential current signals are ultimately transformed into a single ended voltage signal output.

$I_{DC}$ is the feedback current from the offset canceling circuit 452 which compensates for any leakage and/or back-light current in the photo-diode. Thus, when no infrared pulses are being received by photo-diode 24, then $I_{IR}$ is completely offset by $I_{DC}$ such that no input data current signal $I_{IN}$ is flowing. Offset canceling circuit 452 also establishes minimum operating currents in diodes D1 and D2 in order to forward bias transistors Q1 and Q2 to have equal current values (i.e. $I_{O1}=I_{O2}$) when no signal is present.

When an infrared signal is active, then $I_{IN}$ is modulated by the received data signal and adds to the current from diode D1 in order to drive transistor Q2, thus modulating the current flowing in Q2 with the received data signal. Because the current in current source I3 is a constant current, the modulations in the current in transistor Q2 are compensated by a corresponding complementary modulation of the current in transistor Q1 resulting in complementary output current signals $I_{O1}$ and $I_{O2}$. During no-signal or low signal strength conditions, $I_{AGC}$ is relatively low which lowers bias currents of current sources I1 and I2 and, therefore, any incoming signal current $I_{IN}$ that is present represents a higher proportion of the current flowing in diode D1 and driving the base of transistor Q2 than when bias currents I1 and I2 are higher. (Current sources I1 and I2 are typically implemented as current mirrors which are driven by a voltage signal to reflect a current in the driving circuit.) The gain of input stage 454A is therefore relatively high. As incoming signal strength increases, $I_{AGC}$, acting as a bias current control signal, increases and drives I1 and I2 to higher levels of bias current causing a corresponding increase in the current in diodes D1 and D2. Thus, the data current signal $I_{IN}$ becomes a relatively smaller proportion of the current in diode D1 thereby lowering the gain of input stage 454A. The performance of input stage 454A can be characterized as:

$I_{out}=I_{O1}I_{O2}=(I3/I_{AGC})*I_{IN}$, where $I_{AGC}=I1=I2$ ($I_{AGC}$ is typically determined by a voltage value used to drive the gate of an NMOS current mirror for each of I1 and I2).

Figure 6:
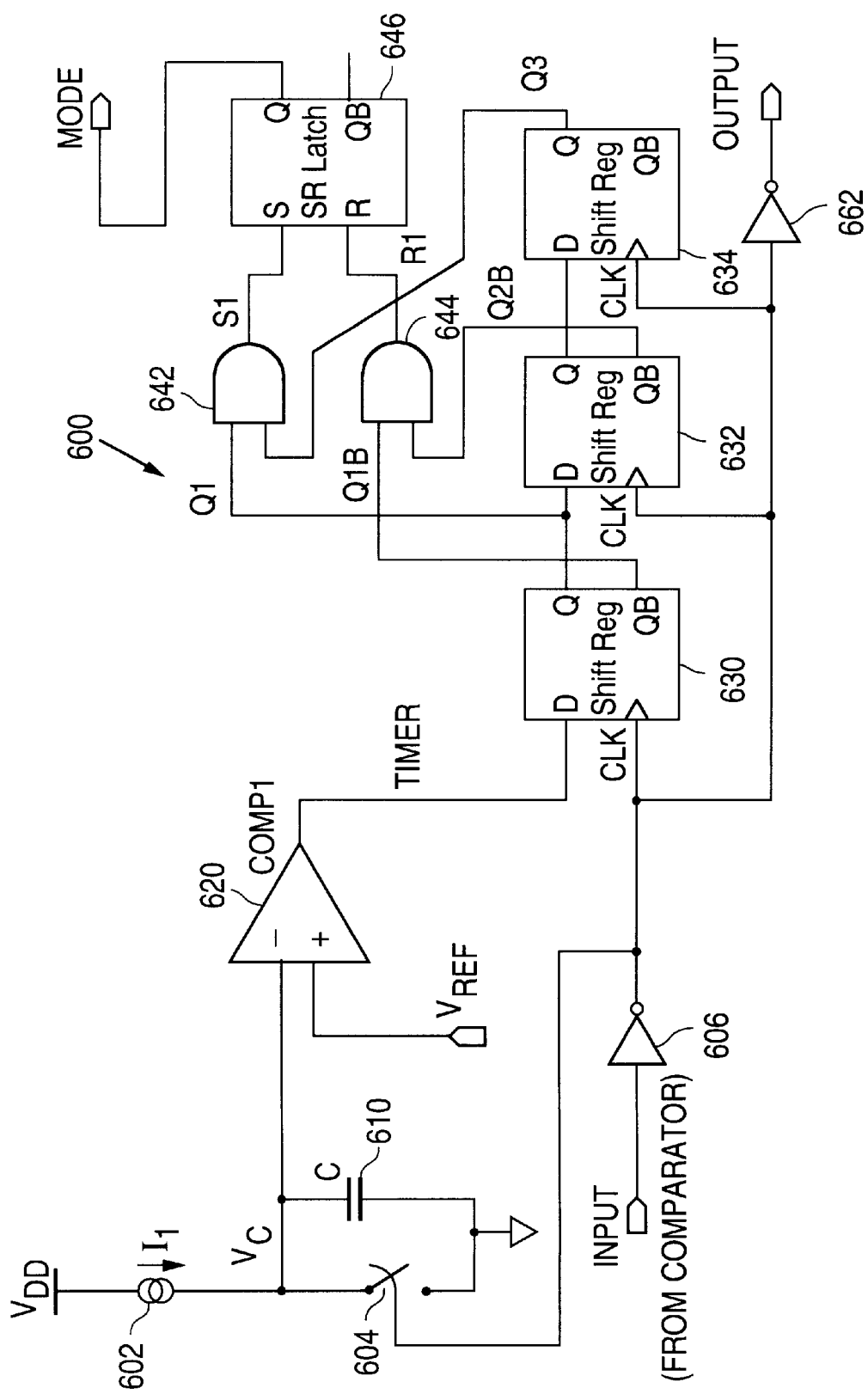
FIG. 6 is a functional block diagram of a mode selection circuit according to the present invention that is suitable for use in either the receiver of FIG. 2 or the receiver of FIG. 4.

An embodiment of a circuit 600 suitable for use as the mode selection circuit 240 of FIG. 2 or mode selection circuit 470 of FIG. 4 is shown in FIG. 6. The output of either inverter 224 in FIG. 2 or comparator 458 of FIG. 4 (which may pass through anti-glitch circuit 462 if the anti-glitch circuit is included in the receiver) is the INPUT signal to inverter 606. The output of inverter 606 controls switch 604 which is connected in parallel with capacitor 610 between the inverting input of comparator 620 and a ground potential. Current source 602 is coupled between supply voltage $V_{DD}$ and the inverting input of comparator 620 and conducts a fixed current I1 of predetermined magnitude. The non-inverting input terminal of comparator 620 receives a pre-determined reference voltage $V_{REF}$.

Figure 7:
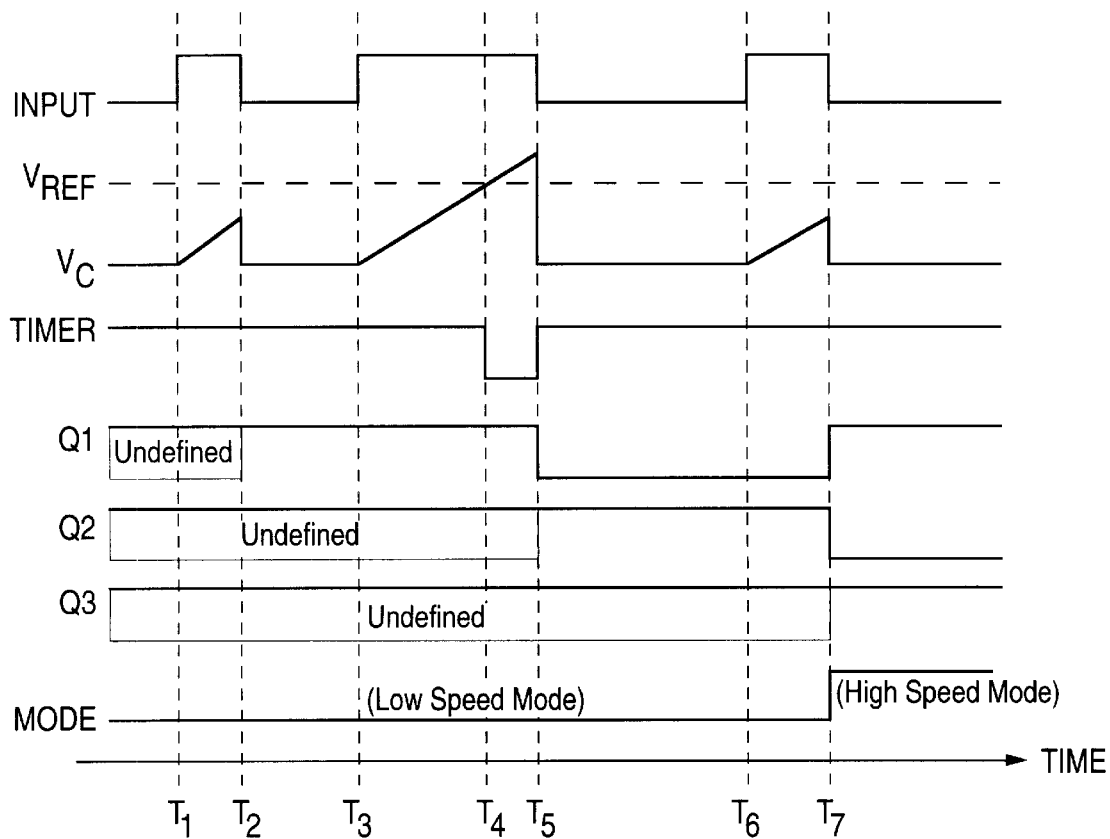
FIG. 7 is a waveform diagram illustrating the function of the mode selection circuit of FIG. 6.

As illustrated in the waveforms of FIG. 7, when the value of the INPUT signal is low, then the output of inverter 606 is high which closes switch 604 and discharges the voltage $V_C$ across capacitor 610 to ground. However, when the INPUT signal is high, corresponding to an active data pulse, then the output of inverter 606 is low and switch 604 opens. At this point, such as times $T_1$, $T_3$ and $T_6$ in FIG. 7, current source 602 charges capacitor 610 at a steady rate which results in the magnitude of $V_C$ corresponding to the duration of the pulse in the INPUT signal. If the duration of the pulse in the INPUT signal is sufficiently long that the magnitude of $V_C$ exceeds the magnitude of $V_{REF}$, such as at time $T_4$, then the output signal TIMER of comparator 620 will transition from a high to a low state. Thus, comparator 620, capacitor 610, switch 604 and current source 602 combine to form an analog timer subcircuit which times the duration of the pulses in the INPUT signal.

The TIMER signal is input to the first of three flip-flops 630, 632 and 634 which are connected in series with one another and clocked by the output of inverter 606. The output of each flip-flop is coupled to the input of the next flip-flop in the series. The series of flip-flops 630, 632 and 634 stores the TIMER signal corresponding to three sequential pulses in the INPUT signal.

Each word of the IrDA preamble for high speed operation consists of a first logical one pulse followed by seven consecutive zero values, a second logical one pulse followed by a single zero value, a third logical one pulse followed by a single zero value, and a fourth logical one pulse followed by three zero values (i.e. 1000000010101000). The high speed preamble word is repeated at least sixteen times. When the receiver is in low speed operational mode, the rapid transitions of the second, third and fourth logical one pulses are typically lost due to the lower receiver response bandwidth in low speed mode and the three high speed pulses typically appear to merge as a single longer duration pulse which is approximately equal to the duration of a low speed pulse.

An example of a waveform for the INPUT signal that results from a receiver in low speed mode receiving the high speed preamble is shown in FIG. 7. The first one pulse of the preamble results in a first pulse in the INPUT signal between times $T_1$ and $T_2$. The second, third and fourth logical one pulses of the preamble word cause the long duration pulse in the INPUT signal between times T3 and T5. The first one pulse of the next preamble word results in the pulse in the INPUT signal between times $T_6$ and $T_7$. The INPUT signal pulse train pattern of a high speed pulse, followed by a long low speed pulse, followed by another high speed pulse is unique to the high speed preamble in an IrDA pulse train. Low speed mode is characterized by two long low speed pulses in a row.

By observing the duration of the first and third pulses of the INPUT signal, the high speed pulse train of an IrDA preamble can be identified even when the receiver is operating in low speed mode. In the mode select circuit 600 of FIG. 6, the output signal Q1 of flip-flop 630 and the output signal Q3 of flip-flop 634 are input to AND gate 642 to produce the S1 signal that is input to the set terminal S of SR latch 646. The signal Q1B output from the inverting output of flip-flop 630 and the signal Q2B output from the inverting output of flip-flop 632 are input to AND gate 644 to produce signal R1 which is input to the reset terminal R of SR latch 646.

When the first and third pulses in a pulse train are short duration high speed pulses, then Q1 and Q3 are logical one values resulting in S1 also being a logical one and Q1B is a logical zero value resulting in R1 being a logical zero. Thus, the MODE signal output from the non-inverting output terminal of SR latch 646 transitions to a logical one indicating high speed operational mode. If two low speed pulses are received sequentially, then Q1B and Q2B will become logical one values causing R1 to become a logical one value which will reset SR latch 646 and the MODE signal will be a logical zero value indicating low speed operational mode.

The MODE signal output by mode selection circuit 600 subsequently controls the variable voltage reference 214 and switch 230 of receiver 200 in FIG. 2 or the AGC control circuit 456 and switch 474 of receiver 450 in FIG. 4 in order to control the receive response bandwidth and input sensitivity of receivers 200 and 450.

Figure 8:
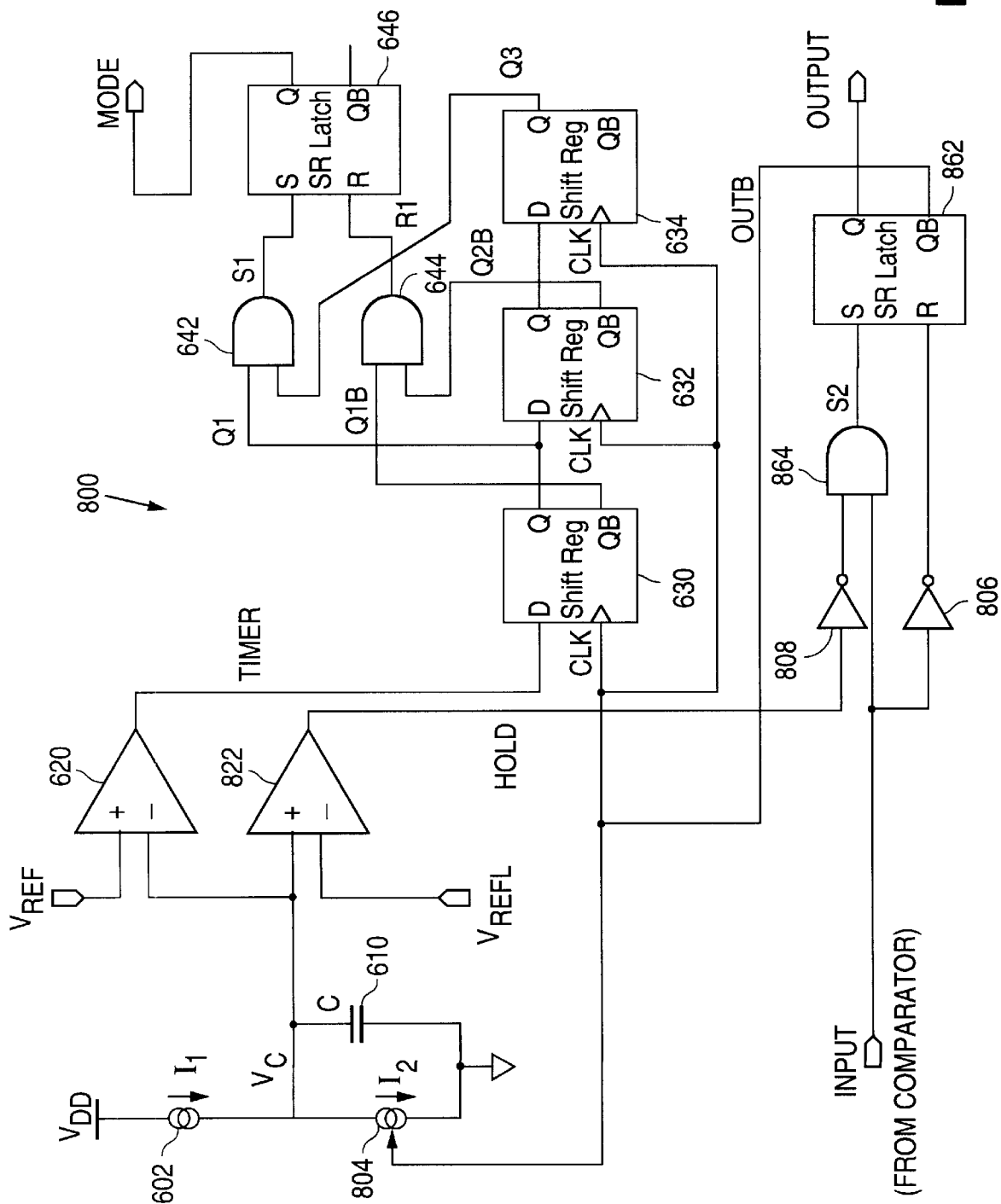
FIG. 8 is a functional block diagram of a mode selection circuit according to the present invention that includes a hold-off function and which is also suitable for use in either the receiver of FIG. 2 or the receiver of FIG. 4.
Figure 9:
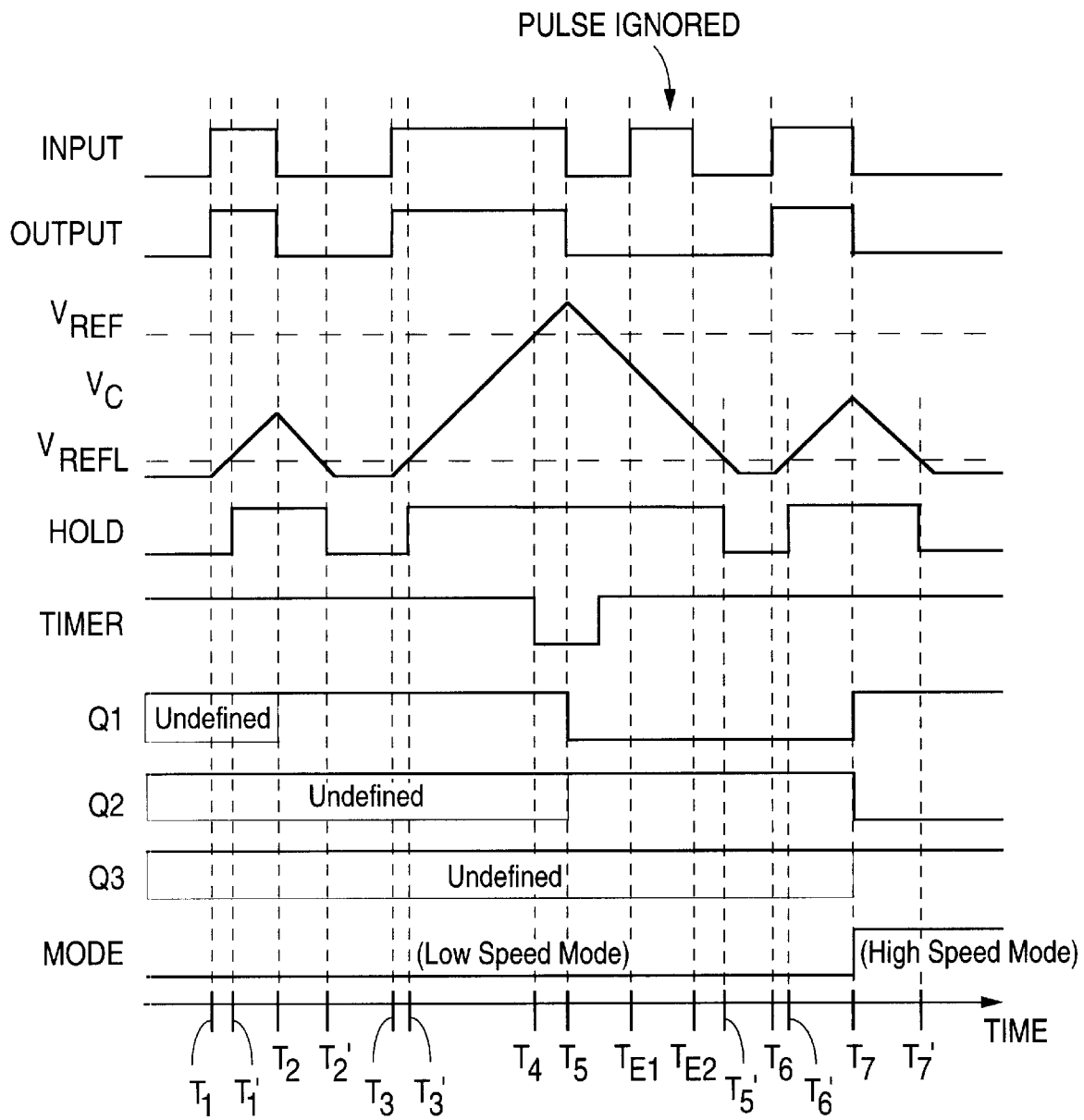
FIG. 9 is a waveform diagram illustrating the function of the mode selection circuit of FIG. 8.

Another embodiment of a mode selection circuit 800 according to the present invention, which also includes an adjustable hold-off function, is shown in FIG. 8. The operation of mode selection circuit 800 responsive to a high speed pulse train in an INPUT signal received from either inverter 224 of FIG. 2 or comparator 458 of FIG. 4 is illustrated in the waveform diagram of FIG. 9.

A hold-off function is useful for suppressing spurious transitions in the pulse train. A characteristic of IrDA pulses is that each active high pulse is followed by a period of inactivity which is at least as long as the active high pulse. Mode selection circuit 800 includes a hold-off function which exploits this characteristic of IrDA pulses to suppress spurious pulses which may occur in the period following an active high pulse. The same approach may be applied to non-IrDA communications formats having a predictable time interval after a valid pulse occurs during which no valid pulses should arrive.

In mode selection circuit 800, switch 604 of FIG. 6 is replaced with current sink 804 which conducts a fixed current I2 under the control of the inverted output signal OUTB output from the inverting terminal of SR latch 862. The INPUT signal is inverted by inverter 806 to generate signal PB which then drives the reset terminal R of SR latch 862 which effectively inverts the INPUT signal again such that it appears, in modified form, as the OUTPUT signal at the non-inverting output terminal of SR latch 862 which can be coupled to the output terminal Dou of either receiver 200 of FIG. 2 or receiver 450 of FIG. 4.

The OUTPUT signal is modified by the HOLD signal output from comparator 822 which compares the voltage $V_C$ across capacitor 610 to reference voltage level $V_{REFL}$, which is lower in magnitude than reference voltage $V_{REF}$ used to generate the TIMER signal. The HOLD signal is inverted by inverter 808 to produce signal HB that is input to AND gate 864 along with the INPUT signal in order to produce the signal S2 that drives the set terminal S of SR latch 862. When $V_C$ is greater than $V_{REFL}$, the HOLD signal is at a logical high level which is transformed to a logic low value in signal HB which blocks an errant logical high pulse in the INPUT signal from setting SR latch 862 and prevents the errant pulse from producing a pulse in the OUTPUT signal.

The hold-off period of the circuit of FIG. 8 is determined by the magnitude of current I2 in current sink 804. When OUTB is a logical low value, corresponding to a valid active pulse in the INPUT signal, such as at time intervals $T_1$ to $T_2$, $T_3$ to $T_4$ and $T_6$ to $T_7$ in FIG. 9, then current sink 804 is inactive and current source 602 charges capacitor 610 at a rate determined by the magnitude of I1 and, consequently, $V_C$ rises.

When OUTB is a logical high value, corresponding to the absence of a pulse in the INPUT signal, such as at time intervals $T_2$ to $T_3$, $T_5$ to $T_6$ and after $T_7$, then current sink 804 actively sinks current I2 and, if the magnitude of I2 is greater than the magnitude of I1, then capacitor 610 is discharged and $V_C$ drops. If the magnitude of I2 is selected to be twice that of I1, then capacitor 610 will discharge at the same rate that it charged and $V_C$ will drop at the same rate as it rose and the hold-off period resulting from an active pulse, such as the time intervals from $T_2$ to $T_2'$, $T_5$ to $T_5'$ and $T_7$ to $T_7'$, will be slightly less than the duration of the active pulse.

Thus, in the circuit of FIG. 8, the errant pulse in the INPUT signal which occurs in the time interval $T_{E1}$ to $T_{E2}$ following the valid pulse in the time interval $T_3$ to $T_4$ is blocked because it occurs during the hold-off period from $T_5$ to $T_5'$. As a result, mode selection circuit 800 ignores the errant pulse and recognizes that the pulse train in the INPUT signal shown in FIG. 9 corresponds to a high speed signal and the MODE signal transitions to a logical high value at $T_7$. This scenario is illustrated in the waveform diagram of FIG. 9 wherein $V_C$ rises and falls with the same slope.

Once $V_C$ drops below reference voltage $V_{REFL}$, then the HOLD signal output by comparator 822 will transition to an active low level which will permit an active pulse in the INPUT signal to set SR latch 862 and produce an active pulse in the OUTPUT signal. The hold-off period of the HOLD signal is determined by the magnitude of I2 relative to the magnitude of I1 as well as by the magnitude of reference voltage $V_{REFL}$. By selecting a magnitude for I2 which is greater than twice that of I1, a hold-off period that is shorter than the active pulse length can be obtained. Similarly, reducing the magnitude of I2 to a level that is below twice the magnitude of I1 will result in a hold-off period that is longer than the active pulse length.

Furthermore, it is important to note that mode selection circuit 800 of FIG. 8 accomplishes both the mode selection function and the hold-off function discussed above using a single capacitor 610.

Figure 10:
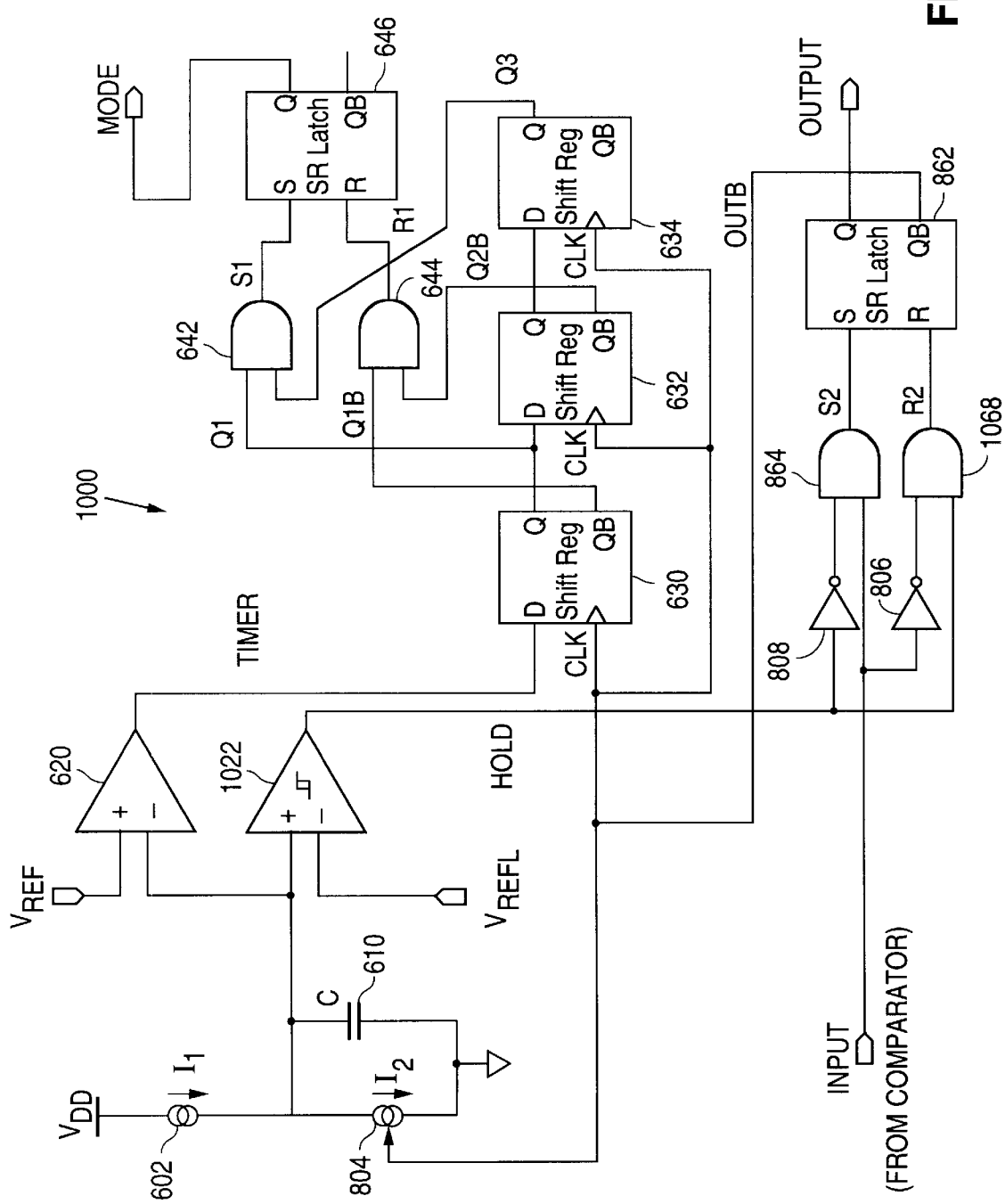
FIG. 10 is a functional block diagram of a mode selection circuit according to the present invention that includes a hold-off function and a minimum pulse threshold function which is also suitable for use in either the receiver of FIG. 2 or the receiver of FIG. 4.
Figure 11:
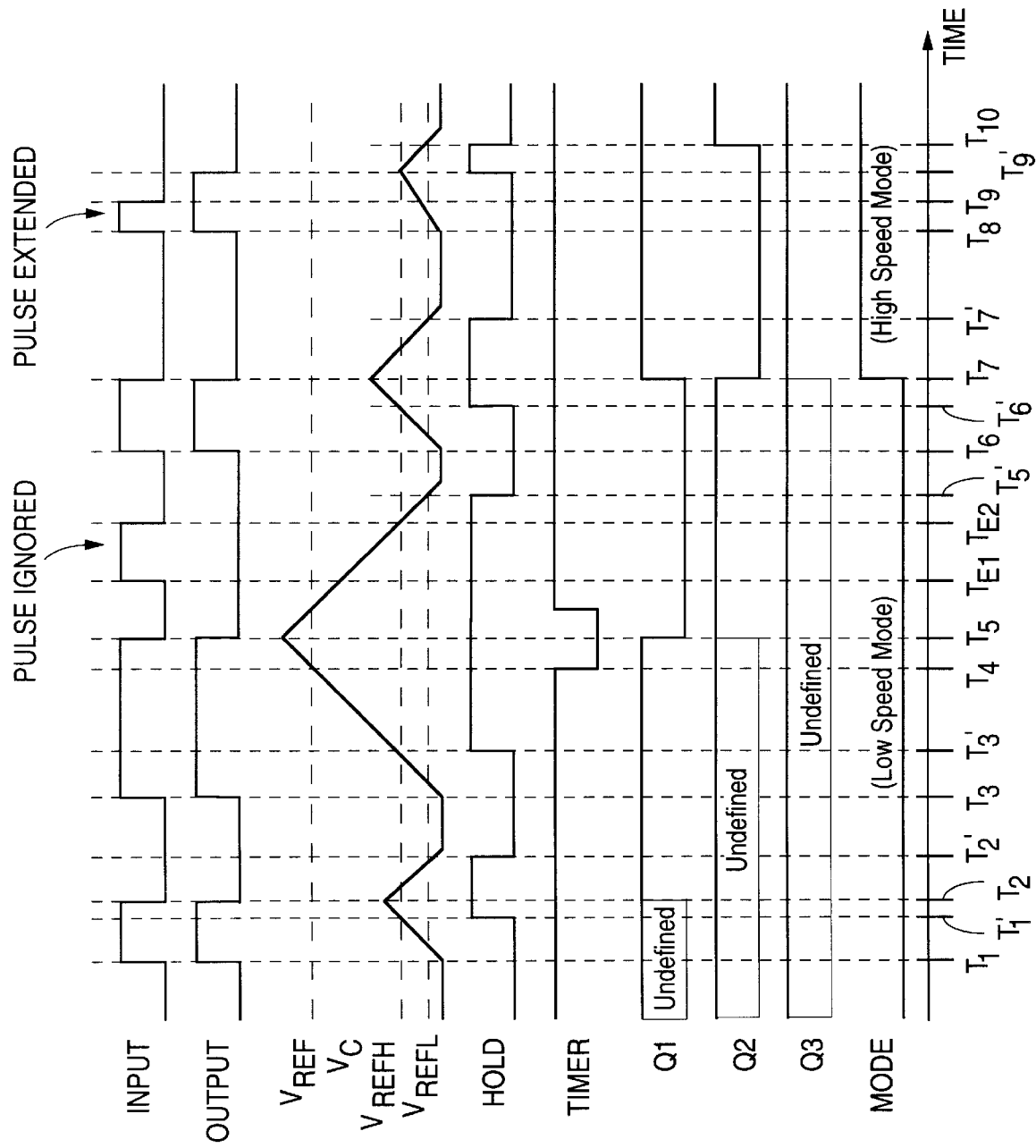
FIG. 11 is a waveform diagram illustrating the function of the mode selection circuit of FIG. 10.

Yet another embodiment of a mode selection circuit 1000 according to the present invention, which includes a minimum pulse width threshold function in addition to the adjustable hold-off function of mode selection circuit 800, is shown in FIG. 10. The operation of mode selection circuit 1000 responsive to a high speed pulse train in an INPUT signal received from either inverter 224 of FIG. 2 or comparator 458 of FIG. 4 is illustrated in the waveform diagram of FIG. 11.

In mode selection circuit 1000, a comparator 1022 having hysteresis replaces comparator 822 of mode selection circuit 800 in FIG. 8. Comparator 1022 does not transition from a low output level to a high output level until voltage $V_C$ across capacitor 610 reaches a voltage reference level of $V_{REFH}$ which is greater than $V_{REFL}$ but less than $V_{REF}$. However, when transitioning from a high output state to a low output state, comparator 1022 does not switch until $V_C$ has dropped to $V_{REFL}$.

The HOLD signal output from comparator 1022 is input to AND gate 1068 along with the PB signal output from inverter 806 in order to produce the R2 signal which drives the reset terminal R of SR latch 862. The result is that the HOLD signal transitions from a low state to a high state, such as at times $T_1'$, $T_3'$, $T_6'$ and $T_9'$, at the higher reference voltage level $V_{REFH}$ than does the circuit of FIG. 8, but transitions from a high state to a low state at the same time interval after the falling edge of a valid active pulse. However, the delay introduced to the rising edge of the HOLD signal by the hysteresis of comparator 1022 creates an interval, such as from $T_9$ to $T_9'$, during which a falling edge of a pulse in the INPUT signal will be ignored. If a valid active high pulse in the INPUT signal has a duration which is below the threshold determined by the selection of VREFH, such as the pulse occurring in the interval $T_8$ to $T_9$, then the falling edge of the pulse, at time $T_9$, will be ignored until $V_C$ rises to $V_{REFH}$, at $T_9'$. This extends the length of the pulse in the OUTPUT signal which is produced in response to the INPUT signal pulse to a minimum duration determined by the magnitude of $V_{REFH}$ which can be useful when the communications protocol employed specifies pulses of minimum length. Also, the hold-off period provided by the HOLD signal will also be lengthened to a minimum duration which is also determined by the magnitude of $V_{REFH}$, such as the interval from $T_9'$ to $T_{10}$.

Note that mode selection circuit 1000 of FIG. 10 accomplishes the mode selection function, the hold-off function and the minimum threshold pulse width functions discussed above using a single capacitor 610.

Having illustrated and described the principles of the present invention in the context of the embodiments described above, it should be readily apparent to those skilled in the art that the invention can be modified in arrangement and detail without departing from such principles. For example, while the present invention is described above in the context of an infrared receiver, it should be readily understood that the present invention is applicable to other signal receivers without departing from the scope and spirit of the present invention. Furthermore, while much of the circuitry described herein is constructed using analog circuits, such as the analog timer and comparators, it should be readily understood that similar function can be obtained using digital components.

I claim:

1. A receiver circuit, the circuit comprising:

a circuit input terminal configured to receive an input data signal;

a circuit output terminal;

an input amplifier having input and output terminals, the input terminal of the input amplifier being coupled to the circuit input terminal;

a first comparator having first and second input terminals and an output terminal, the first input terminal being coupled to the output terminal of the input amplifier, the second input terminal being configured to receive a detection threshold voltage, and the output terminal of the first comparator being coupled to the circuit output terminal;

a filter;

a switch coupled in series with the filter between the first input terminal of the first comparator and a first power supply rail, the switch having a control terminal, wherein the switch is configured to switch to a first position responsive to receiving a low speed mode control signal at the control terminal of the switch, and further wherein the switch is configured to switch to a second position responsive to receiving a high speed mode control signal at the control terminal of the switch, and further wherein the switch is configured to switch to a second position responsive to receiving a high speed mode control signal at the control terminal of the switch; and a mode selection circuit having input and output terminals, wherein the input terminal of the mode selection circuit is coupled to the output terminal of the first comparator and the output terminal of the mode selection circuit is coupled to the control terminal of the switch, and further wherein the mode selection circuit is configured to generate the low speed mode control signal responsive to a low speed data signal generated at the output of the first comparator responsive to the input data signal and generate the high speed mode control signal responsive to a low speed data signal generated at the output of the first comparator responsive to the input data signal.

2. The receiver circuit of claim 1, further including a variable voltage generator having an output terminal coupled to the second input terminal of the first comparator and a control terminal coupled to the output terminal of the mode selection circuit, wherein the variable voltage generator is configured to generate the detection threshold voltage at the output terminal of the variable voltage generator, the variable voltage generator being configured to set the detection threshold voltage to a first detection threshold voltage level responsive to the low speed mode control signal and set the detection threshold voltage to a second detection threshold voltage level responsive to the high speed mode control signal.

3. The receiver circuit of claim 1, wherein the input amplifier further includes a control terminal, wherein the control terminal of the input amplifier is coupled to the output terminal of the mode selection circuit, the input amplifier being configured to amplify with a first gain level responsive to the low speed mode control signal and a second gain level responsive to the high speed mode control signal, wherein the first gain level is greater than the second gain level.

4. The receiver circuit of claim 1, wherein the filter further comprises:
   a resistor coupled between the output terminal of the input amplifier and a second power supply rail; and
   a capacitor coupled in series with the switch between the output terminal of the input amplifier and the first power supply rail.

5. The receiver circuit of claim 1 wherein the mode selection circuit is further configured to time a period between transitions in a data signal generated at the output of the first comparator and output the low speed mode control signal when the period between transitions is greater than a first predetermined time value and output the high speed mode control signal when the period between transitions is between a second predetermined time value and the first predetermined time value, where the first predetermined time value is greater in magnitude than the second predetermined time value.

6. The receiver circuit of claim 5 wherein the mode selection circuit is still further configured to initially output the low speed mode control signal and output a current mode control signal when the time between transitions is less than the second predetermined time value, wherein the current mode control signal is one of the high and low speed mode control signals.

7. The receiver circuit of claim 1 wherein the mode selection circuit is further configured to initially generate the low speed mode control signal and to time the duration of a first pulse and the duration of a second pulse in a data signal generated at the output of the first comparator and output the low speed mode control signal when the duration of each of the first and second pulses is greater than a predetermined low speed threshold value, wherein the first and second pulses are sequential to one another.

8. The receiver circuit of claim 7 wherein the mode selection circuit is still further configured to measure the duration of a third pulse in the data signal generated at the output of the first comparator and output the high speed mode control signal when the duration of each of the first and third pulses is less than the the predetermined low speed threshold value.

9. The receiver circuit of claim 1, wherein the mode selection circuit further includes:
   a timer configured to receive the data signal generated at the output of the comparator and generate a timing signal responsive to each pulse in the data signal that corresponds to the duration of each pulse;

a second comparator having first and second input terminals and an output terminal, wherein the first input terminal of the second comparator is configured to receive the timing signal generated by the timer and the second input terminal is configured to receive a first reference value, the comparator being configured to output a timer signal having a first timer value corresponding to a low speed pulse and a second timer value corresponding to a high speed pulse;

a storage register configured to store the timer signal responsive to each pulse in the data signal;

a combinational circuit configured to receive the timer signal stored in the storage register and, responsive thereto, output the low speed mode control signal responsive to the first timer value and output the high speed mode control signal responsive to the second timer value.

10. The receiver circuit of claim 9, wherein:
    the storage register is further configured to store the timer signal for three sequential pulses in the data signal; and
    the combinational circuit is further configured to output the low speed mode control signal when the timer signal stored for a first one of the three sequential pulses is the first timer value and the timer signal stored for a second one of the three sequential pulses is the second timer value, and further wherein the combinational circuit is configured to output the high speed mode control signal when the timer signal stored for the first one of the three sequential pulses is the second timer value and the timer signal stored for a third one of the three sequential pulses is the second timer value.

11. A receiver circuit, the circuit comprising:
    a circuit input terminal configured to receive an input data signal;
    a circuit output terminal;
    an input amplifier having input and output terminals, the input terminal of the input amplifier being coupled to the circuit input terminal;
    a first comparator having first and second input terminals and an output terminal, the first input terminal being coupled to the output terminal of the input amplifier, the second input terminal being configured to receive a detection threshold voltage, and the output terminal of the first comparator being coupled to the circuit output terminal;
    a filter;
    a switch coupled in series with the filter between the output terminal of the input amplifier and a first power supply rail, the switch having a control terminal, wherein the switch is configured to switch to a first position responsive to receiving a low speed mode control signal at the control terminal of the switch, and further wherein the switch is configured to switch to a second position responsive to receiving a high speed mode control signal at the control terminal of the switch, and further wherein the switch is configured to switch to a second position responsive to receiving a high speed mode control signal at the control terminal of the switch; and
    a mode selection circuit having input and output terminals, wherein the input terminal of the mode selection circuit is coupled to the output terminal of the first comparator and the output terminal of the mode selection circuit is coupled to the control terminal of the switch, and further wherein the mode selection circuit is configured to generate the low speed mode control signal responsive to a low speed data signal generated at the output of the first comparator responsive to the input data signal and generate the high speed mode control signal responsive to a high speed data signal generated at the output of the first comparator responsive to the input data signal, and where the mode selection circuit further includes:

a timer configured to receive the data signal generated at the output of the comparator and generate a timing signal responsive to each pulse in the data signal that corresponds to the duration of each pulse, a second comparator having first and second input terminals and an output terminal, wherein the first input terminal of the second comparator is configured to receive the timing signal generated by the timer and the second input terminal is configured to receive a first reference value, the comparator being configured to output a timer signal having a first timer value corresponding to a low speed pulse and a second timer value corresponding to a high speed pulse, a storage register configured to store the timer signal responsive to each pulse in the data signal, where the storage register is further configured to store the timer signal for three sequential pulses in the data signal, and a combinational circuit configured to receive the timer signal stored in the storage register and, responsive thereto, output the low speed mode control signal responsive to the first timer value and output the high speed mode control signal responsive to the second timer value, where the combinational circuit is further configured to output the low speed mode control signal when the timer signal stored for a first one of the three sequential pulses is the first timer value and the timer signal stored for a second one of the three sequential pulses is the second timer value, and further wherein the combinational circuit is configured to output the high speed mode control signal when the timer signal stored for the first one of the three sequential pulses is the second timer value and the timer signal stored for a third one of the three sequential pulses is the second timer value;

a third comparator having first and second input terminals and an output terminal, wherein the first input terminal of the third comparator is configured to receive the timing signal generated by the timer and the second input terminal is configured to receive a second reference value, the comparator being configured to output a hold signal, wherein the second reference value is smaller in magnitude than the first reference value;

a latch interposed between the circuit input terminal and the circuit output terminal wherein an output value of the latch is set when the data signal is a logical high value and the hold signal is a logical low value and wherein the output value of the latch is reset when the data signal is a logical low value; and the timer is further configured to decrease the timing value at a predetermined rate responsive to a falling edge of each pulse in the data signal.

12. The receiver circuit of claim 11, wherein the predetermined rate corresponds to the duration of each pulse.

13. The receiver circuit of claim 11, wherein:

the third comparator is further configured to have hysteresis wherein the hold signal transitions from the logical low value to the logical high value responsive to the timing value being equivalent to a third reference value, wherein the third reference value is intermediate the first and second reference values, and the hold signal transitions from the logical high value to the logical low value responsive to the timing value being equivalent to the second reference value; and the latch interposed between the circuit input and circuit output terminals is further configured to be reset when the hold signal is the logical high value and the data signal is the logical low value.

14. The receiver circuit of claim 13, wherein the timer further comprises:

a capacitor, wherein the timing signal is the voltage across the capacitor;

a current source configured to charge the capacitor at a first fixed rate; and a current sink configured to discharge the capacitor at a second fixed rate responsive to the output value of the latch interposed between the circuit input and circuit output terminals, wherein the first fixed rate is less than the second fixed rate.

15. A method for receiving high and low speed signals in a receiver, the method comprising the steps:

providing a receive path configured to receive an input data signal, wherein the input data signal includes one of the high speed signal and the low speed signal;

comparing the input data signal to a detection threshold voltage in order to produce a demodulated data signal;

setting a receive response bandwidth of the receive path to a first bandwidth level responsive to a low speed mode control signal and to a second bandwidth level responsive to a high speed mode control signal, wherein the second bandwidth level is greater than the first bandwidth level;

generating the low speed mode control signal responsive to the low speed signal; and generating the high speed mode control signal responsive to the high speed signal.

16. The method of claim 15, further including the steps:

generating the low speed mode control signal responsive to the absence of the high speed signal and the low speed signal; and initially generating the low speed mode control signal in the presence of one of the high speed signal and the low speed signal.

17. The method of claim 15, wherein the step of setting the receive response bandwidth of the receive path includes the steps:

closing a capacitive path to a ground potential responsive to the low speed mode control signal; and opening the capacitive path to the ground potential responsive to the high speed mode control signal.

18. The method of claim 15, wherein the step of generating the low speed mode control signal responsive to the low speed signal includes generating the low speed mode control signal when both a first and second pulse in the demodulated data signal are low speed pulses, wherein the second pulse is subsequent to the first pulse.

19. The method of claim 18, wherein the step of generating the low speed mode control signal when both a first and second pulse in the demodulated data signal are low speed pulses includes:

timing a duration of the first pulse;

timing a duration of the second pulse; and generating the low speed mode control signal when the duration of the first pulse and the duration of the second pulse are each greater than a first predetermined value.

20. The method of claim 18, wherein the step of generating the high speed mode control signal responsive to the high speed signal includes generating the low speed mode control signal when both a first and third pulse in the demodulated data signal are high speed pulses, wherein the third pulse is subsequent to the second pulse.

21. The method of claim 20, wherein the step of generating the high speed mode control signal when both the first and a third pulse in the demodulated data signal are high speed pulses includes:

timing a duration of the first pulse;
   timing a duration of the third pulse; and
   generating the high speed mode control signal when both the duration of the first pulse and the duration of the second pulse are less than a first predetermined value.

22. The method of claim 21, wherein the steps of timing a duration of the first pulse, timing a duration of the second pulse and timing a duration of the third pulse are each accomplished by charging a capacitor at a first fixed rate responsive to a pulse in the input data signal.

23. The method of claim 22, further including the step of suppressing subsequent pulses in the demodulated data signal responsive to a preceding pulse in the demodulated data signal for a time interval that is proportional to a duration of the preceding pulse in the demodulated data signal.

24. The method of claim 23, wherein the step of suppressing subsequent pulses in the demodulated data signal responsive to a preceding pulse in the demodulated data signal includes:

generating a hold signal by discharging the capacitor at a second fixed rate responsive to a falling edge of the preceding pulse, wherein the second fixed rate is greater than the first fixed rate; and
   gating the demodulated data signal with the hold signal in order to produce an output data signal.

25. The method of claim 24, further including the step of delaying a falling edge of a pulse in the output data signal responsive to a rising edge of a corresponding pulse in the demodulated data signal when the duration of the corresponding pulse in the demodulated data signal is less than a minimum pulse width threshold.

26. The method of claim 25, wherein the step of delaying a falling edge of a pulse in the output data signal further includes the steps:

buffering the demodulated signal with a latch in order to produce the output data signal; and
   preventing the latch from being reset responsive to the hold signal.

27. The method of claim 15, wherein the step of comparing the input data signal to a detection threshold voltage in order to produce a demodulated data signal further includes the steps:

setting the detection threshold voltage to a first voltage level responsive to a low speed mode control signal; and
   setting the detection threshold voltage to a second voltage level responsive to a high speed mode control signal, wherein the second voltage level is greater than the first voltage level.

28. The method of claim 15, further including the step of amplifying the input data signal, wherein the input data signal is amplified with a first gain factor responsive to the low speed mode control signal, and the the input data signal is amplified with a second gain factor responsive to the high speed mode control signal, wherein the first gain factor is greater than the second gain factor.

29. A communications receiver, the receiver comprising:

amplifier means for receiving an input data signal and amplifying the input data signal to produce an amplified data signal;
   demodulating means for transforming the amplified data signal into a demodulated data signal;
   filtering means for filtering the amplified data signal;
   switching means coupled in series with the filtering means for activating the filtering means responsive to a low speed mode signal and deactivating the filtering means responsive to a high speed mode signal; and
   mode selection means for monitoring the demodulated data signal and, responsive to a low speed pulse train in the demodulated data signal, generating the low speed mode signal and, responsive to a high speed pulse train in the demodulated data signal, generating the high speed mode signal.

30. The communications receiver of claim 29, wherein the demodulating means is further configured to compare the amplified data signal to a first detection threshold to produce the demodulated data signal responsive to the low speed mode signal and compare the amplified data signal to a second detection threshold to produce the demodulated data signal responsive to the high speed mode signal.

31. The communications receiver of claim 29, wherein the amplifier means is further configured to amplify the input data signal by a first gain factor responsive to the low speed mode signal and amplify the input data signal by a second gain factor responsive to the high speed mode signal.

32. The communications receiver of claim 29, wherein the mode selection means further comprises:

timer means for timing a duration of a pulse in the demodulated data signal in order to produce a timing signal;
   comparison means for comparing the timing signal to a first reference value in order to produce a timer signal having a high speed state when the timing signal is less than the first reference value and a low speed state when the timing signal is greater than or equal to the first reference value;
   storage means for storing the timer signal responsive to each pulse in the demodulated data signal; and
   combinational logic for generating the low speed mode signal responsive to the low speed state of the timing signal being stored in the storage means and generating the high speed mode signal responsive to the high speed state of the timing signal being stored in the storage means.

33. The communications receiver of claim 32, wherein:

the storage means is further configured to store the timing signals corresponding to multiple sequential pulses in the demodulated data signal; and
   the combinational logic is further configured to generate the low speed mode signal responsive to a low speed state being stored for each of first and second pulses of the multiple sequential pulses and generating the high speed mode signal responsive to a high speed state being stored for each of the first pulse and a third pulse of the multiple sequential pulses.

34. The communications receiver of claim 32, wherein the mode selection means further comprises:

buffering means for buffering the demodulated data signal in order to produce an output data signal;

hold-off means for comparing the timing signal to a second reference value in order to prevent the buffering means from transitioning responsive to the demodulated data signal while the timing signal is greater than the second reference value, wherein the first reference value is greater than the second reference value; and wherein the timing means is further configured to decrease the timing signal at a predetermined rate responsive to a falling edge in the output data signal.

35. The communications receiver of claim 34, wherein the hold-off means is further configured to prevent the buffering means from resetting the output data signal until the timing signal exceeds a third reference value, wherein the third reference value is greater than the second reference value and less than the first reference value.

* * * * *